(12) United States Patent
Goumaz

(10) Patent No.: US 6,225,837 B1
(45) Date of Patent: May 1, 2001

(54) CHARGE SAMPLING CIRCUIT

(75) Inventor: Jean-François Goumaz, Meyrin (CH)

(73) Assignee: LeCroy S.A., Meyrin (CH)

( * ) Notice: Subject to any disclaimer, the term of this patent is extended or adjusted under 35 U.S.C. 154(b) by 0 days.

(21) Appl. No.: 08/210,298

(22) Filed: Mar. 18, 1994

(30) Foreign Application Priority Data

Apr. 8, 1993 (EP) .................................................. 93105836

(51) Int. Cl.[7] .................................................. G11C 27/02
(52) U.S. Cl. .................................................. 327/91
(58) Field of Search ........................ 327/91–96, 336–345, 327/362, 551, 552

(56) References Cited

U.S. PATENT DOCUMENTS

| | | | |
|---|---|---|---|
| 3,158,759 | * | 11/1964 | Jasper ...................................... 327/93 |
| 3,309,618 | * | 3/1967 | Harris et al. ........................... 327/91 |
| 3,667,055 | * | 5/1972 | Uchida .................................. 327/341 |
| 4,069,447 | | 1/1978 | Frye . |
| 5,010,302 | * | 4/1991 | Krempl et al. ........................ 330/306 |
| 5,132,552 | * | 7/1992 | Ito et al. ............................... 327/345 |

* cited by examiner

*Primary Examiner*—Toan Tran
(74) *Attorney, Agent, or Firm*—Oblon, Spivak, McClelland, Maier & Neustadt, P.C.

(57) ABSTRACT

The charge sampling circuit comprises a current sampling switch, a charge amplifier and a charge-to-voltage converter.

7 Claims, 4 Drawing Sheets

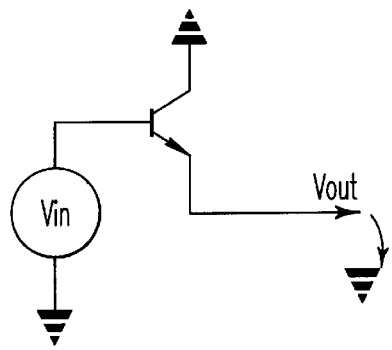
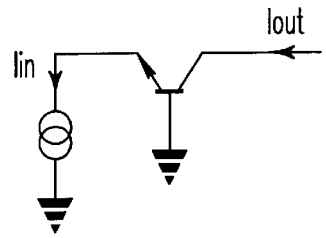
*FIG. 1A*  *FIG. 1B*
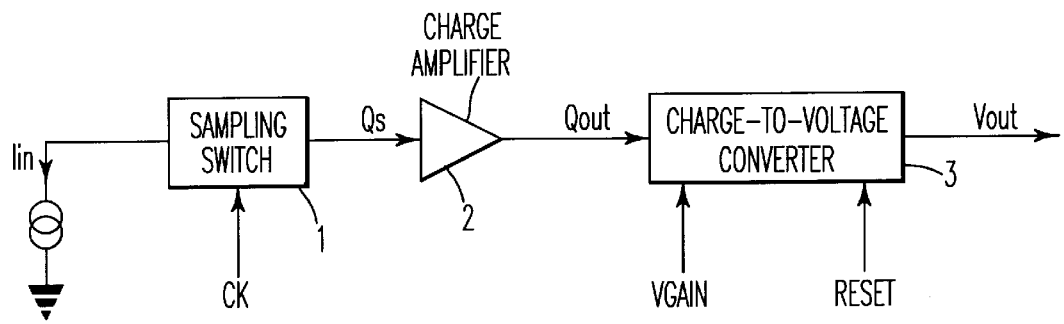
*FIG. 2*
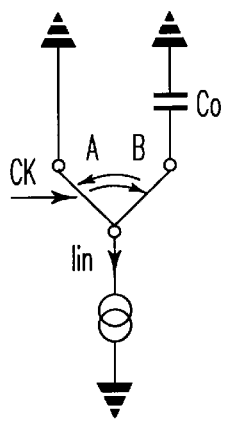
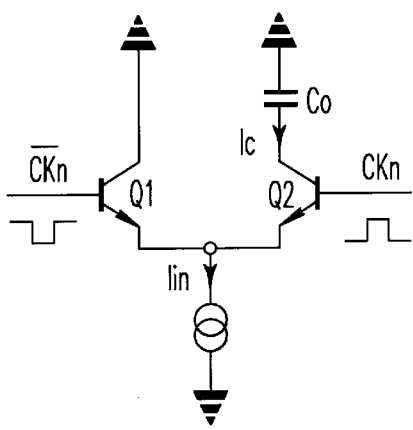
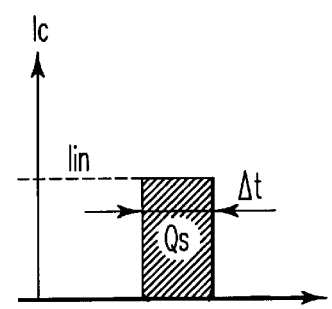
*FIG. 3A*  *FIG. 3B*  *FIG. 3C*

CHARGE SAMPLING CIRCUIT

BACKGROUND OF THE INVENTION

1. Field of the Invention

The present invention applies to a circuit for sampling an analog, time-continuous signal for display on a CRT tube or for digitization by an analog-to-digital converter as in a digital sampling oscilloscope. In particular, it applies to a charge sampling circuit rather than a voltage sampling circuit.

2. Description of the Related Art

Among digital sampling oscilloscopes, distinct classes can be distinguished, taking into account their mode of operation:

a) real time or single shot digitizing instruments where the sample rate is between 2 and 10 times the highest frequency of interest, b) equivalent time or repetitive instruments which are used with repetitive signals, sampling them at a frequency lower than the highest frequency of interest (undersampling) and reconstructing the signal by taking many cycles of the signal to acquire enough data to reconstruct the signal, putting every sample in its proper time position.

The present invention applies to this latter class of instruments which dominate the field of data acquisition with a bandwidth above 1 GHz. Equivalent time or repetitive sampling instruments can again be divided into two classes:

a) sequential sampling instruments which sample a repetitive signal once every n-th cycle, sequentially incrementing the time of sampling relative to the signal cycle. In order to be able to do this, a trigger signal must first be extracted from the signal or from an external source and a sequentially incremented delay added between the trigger point and the sample point. Because it is difficult to produce long delays accurately and because of jitter in the cycle length, a sequential sampling instrument can only accurately view the portion of the signal which occurs after the trigger point.

b) Random Interleaved Sampling (RIS) instruments sample the signal at their own internal rate, which is randomly related to the signal cycle, and record (for every sample acquisition) the precise time position of the sample relative to the signal cycle. The signal is then reconstructed by putting every data point in its proper time slot. The big advantage of this technique is that a RIS instrument is not restricted to show the post trigger part of the signal but can also display the portion of the signal which precedes the trigger point.

As far as it is known, all repetitive sampling instruments use diode sampling gates, as, for example, in bridge quad or travelling wave configurations, to sample the signal. Such a sampling gate is made up of two to six diodes, e.g. fast low storage diodes. The diodes block the signal, except during the very short moment when the signal voltage is allowed to go through the gate and into a sampling preamplifier.

A drawback of a diode sampling gate, however, is that it is a voltage sampling device which generates sampling spikes at every sampling instant. When an instrument has to operate in RIS mode with an "internal" trigger source, the trigger circuit should not receive such sampling spikes generated on the signal by the sampling gate. To do this, an isolation buffer is inserted between the input of the instrument and the sampling gate.

The mandatory presence of this isolation buffer justifies the present invention, in view of the problems with present designs, i.e. when using a diode sampling gate with an isolation buffer:

First, the diode sampling gate needs a high amplitude (<1–2 V) and a very narrow strobe sampling pulse. When operated in RIS mode, the energy fed back to the input signal by the strobe pulse can therefore be fairly large.

Second, the sampling gates are voltage driven, which means that the isolation buffer output must be a voltage.

There are two common transistor circuits available which exhibit the essential characteristics of an isolation buffer, i.e. 1) high bandwidth, and 2) high reverse isolation in the GHz area:

(a) a common collector stage (or emitter follower), which is a voltage-input-voltage-output device, offering wide bandwidth and low reverse isolation at high frequency, limited by the transition frequency of the transistor ($f_T$), (b) a common base stage, which is a current input current output device, offering very high bandwidth and reasonably high reverse isolation at high frequency, not limited by the transition frequency of transistor ($f_T$).

Thus, for reasons both of bandwidth and reverse isolation, a common base stage is better suited for an isolation buffer in front of a sampling gate. However, the output of a common base stage being a current and the diode sampling gate being a voltage sampling device, there is a need to convert the common base stage output signal back to a voltage. This is usually done at the expense of some loss of overall bandwidth.

SUMMARY OF THE INVENTION

In view of these problems in the state of the art of connecting an isolation buffer with a sampling gate, the present invention proposes a charge based sampling circuit. The present invention does not use a diode sampling gate, but rather uses a sampling switch whose signal input is a current and thus does not need a current-to-voltage conversion, after a common base stage isolation buffer. In addition, the sampling spikes are independent of the previous sample state and will usually be smaller than those produced by a diode gate in RIS mode.

Specifically, the present invention can be used as a sampling front end of an oscilloscope comprising a current sampling switch whose input is the signal current and whose output is a charge packet, a charge amplifier whose input is the sampled charge packet and whose output is another charge packet its gain being defined as the ratio of the number of electrons in the output charge packet over the number of electrons in the input charge packet, and a charge-to-voltage converter or charge integrator. After the sampling switch, the useful information of every signal sample is the amount of charge sampled, i.e. the number of electrons in the charge packet, and not the charge packet shape. The function of the subsequent charge amplifier and the charge converter is to process correctly the charge packet content of the output of the sampling switch.

BRIEF DESCRIPTION OF THE DRAWINGS

Other objects and advantages of the present invention become apparent with the following discussion of the FIGS. 1–6 and a specific embodiment of the invention.

FIGS. 1A–B shows two state of the art realizations of an isolation buffer;

FIG. 2 show a block schematic of the inventive charge sampling circuit;

FIGS. 3A–C show the principle and a possible realization of the current sampling switch, and a typically output charge shape of charge $Q_s$;

DETAILED DESCRIPTION OF THE PREFERRED EMBODIMENTS

Figure 4A:
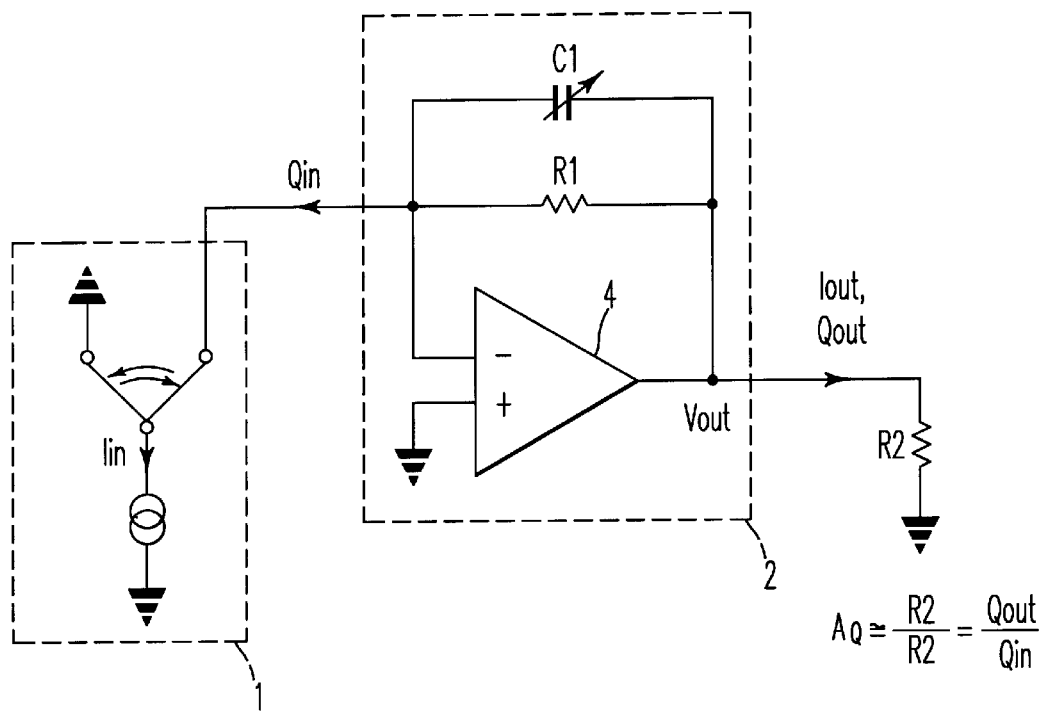
FIGS. 4A–C show the realization of the charge amplifier and an output charge packet shape.
Figure 4B:
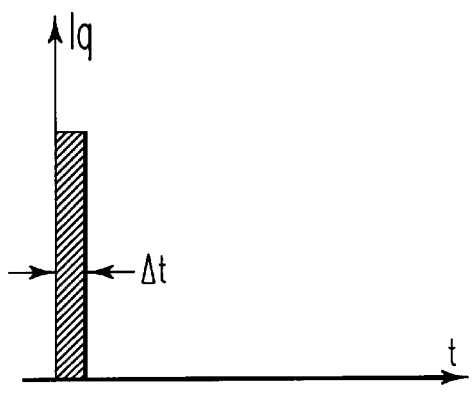

FIGS. 1A–B show two transistor realizations of the two common, state of the art isolation buffers, the common collector stage (FIG. 1A) and the common base stage (FIG. 1B), the latter being of interest, because it is a current based realization.

In FIG. 2 the block diagram shows the three main elements of the present invention, a sampling switch 1 with an external clock input $C_k$, the charge amplifier 2 and a charge-to-voltage converter 3 with an external gain control 7 and a reset 8. The final output is the voltage $V_{out}$.

The operation of the sampling switch 1 is the following (see FIG. 3) : the pair of transistors $Q_1$ and $Q_2$ in FIG. 3B acts like a single pole-double throw switch, staying most of the time in position A (FIG. 3A) and directing the signal current $I_{in}$ to ground. During the sample interval t, defined by the clock pulse $C_k$, the switch is changed to position B and directs the input current towards the charge amplifier 2 and charge-to-voltage converter 3, jointly symbolized here by the capacitor $C_o$. The amount of charge $Q_{sn}$ that is transferred to $C_o$ i.e. to the input of the charge amplifier/charge-to-voltage converter during the n-th sampling interval is equal to:

$$Q_{sn} = \int_{t_n - \Delta t/2}^{t_n + \Delta t/2} o_{IN} dt \qquad 1)$$

Assuming perfect switching and an infinitely short opening and closing process, where $\Delta t$ is the sampling interval, $t_n$ the sampling instant. $\omega_{-3dB}$, the 3dB-bandwidth corresponding to $\Delta t$, obeys the relationship:

$$\frac{2}{X} \sin \frac{X}{2} = \frac{1}{\sqrt{2}} \qquad 2)$$

where $$X = \omega_{-3db} \cdot \Delta t$$

For example, with a $\Delta t$=200 ps, equation 2) gives a 3dB bandwidth $\omega_{-3dB}$ of 2,2 GHz. If the mean current $i_{IN}$ during the sample interval is equal to 2.5 mA, the sampled charge at the output of the sampling switch would be equal to:

$$Q_{sn} = i_{IN} \cdot \Delta t = 500 fC \qquad 3)$$

Since no information can pass the switch if $i_{IN} \leq 0$ (the transistors do not conduct in reverse direction), the input signal normally modulates a current Io and the information resides in the modulation X of current Io.

$$i_{IN} = (1+X) \cdot Io \qquad 4)$$

with $-1<X<1$ X being the modulation index. Practically for noise and distortion reasons one chooses:

$$-0,4 < X < 0,4 \qquad 5)$$

Thus, if one takes the example of a 2.5 mA mean current, one would sample a signal current comprised between 1.5 and 3.5 mA which corresponds to a full scale signal charge of 400 fC. This represents about 2.5 million electrons.

The sample output charge packet has too small a charge to be directly digitizable by an analog to digital converter and first needs to be amplified.

A preferred embodiment of the sampling switch 1 is shown in FIG. 3B) where Q1, Q2 are two emitter coupled fast bipolar transistors. The sampling clock $CK_n$ defines the sampling interval (and therefore the defines the analog bandwidth and determines the distortion characteristics.

Due to the fact that this embodiment of the sampling switch 1 is made with NPN transistors and the conventional direction of the current is going into the sampling switch (see FIG. 4a) it is possible to connect the output of the sampling switch directly to the input of a conventional bipolar operational amplifier 4. The only function of the charge amplifier 2 is to amplify the charge packet $Q_{in}$ linearly and to produce an output charge packet $Q_{out}$ that will be integrated by the next stage i.e., the charge-to-voltage converter 3.

Thus, the functionality of the charge amplifier 2 is different from what is described in U.S. Pat. No. 5,010,302 where the charge "amplifier" has in fact a charge integrating function.

The resistor R1 is conventionally a parasitic component of the integrating feedback capacitor. However, the resistor R1 in this case is a real resistor R1 and the capacitor C1 is a dynamic response trim capacitor which determines the shape of the output charge packet $Q_{out}$ (see FIG. 4C)flowing across resistor 2.

Figure 4C:
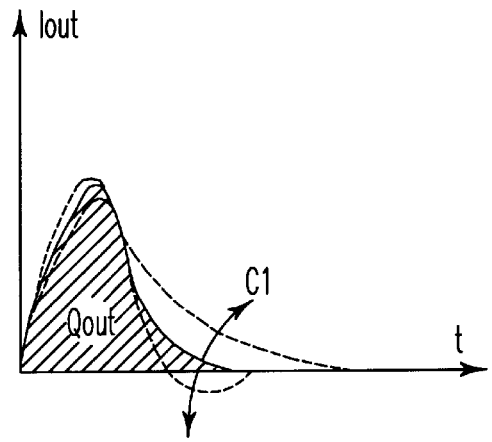

The operational amplifier 4 connected as represented by FIG. 4A and receiving a charge impulse $Q_{in}$ in (charge packet as shown in FIG. 4C) is normally too slow to respond to the incoming charge which will be stored into the input parasitic capacitance of the operational amplifier 4 as well as onto the input plate of the compensating capacitor C1. The equilibrium will be restored through the feedback network R1, C1. $Q_{out}$ will be a positive pulse whose area will be proportional to the input charge packet $Q_{in}$ and whose shape depends on R2 and on the R1 and C1 values and on the operational amplifier's speed. Its value will be $$Q_{out} \int i_{out} \cdot dt = \frac{R_1}{R_2} \cdot Q_{in} \qquad 6)$$

Charge amplification factors of 50 to 100 are easily achievable with present fast operational amplifiers. The amplified sampled charge $Q_{out}$ thus attains a level which is compatible with the intended subsequent integration giving a good signal to noise ratio to the combination charge amplifier/charge-to-voltage converter integrator.

Figure 5A:
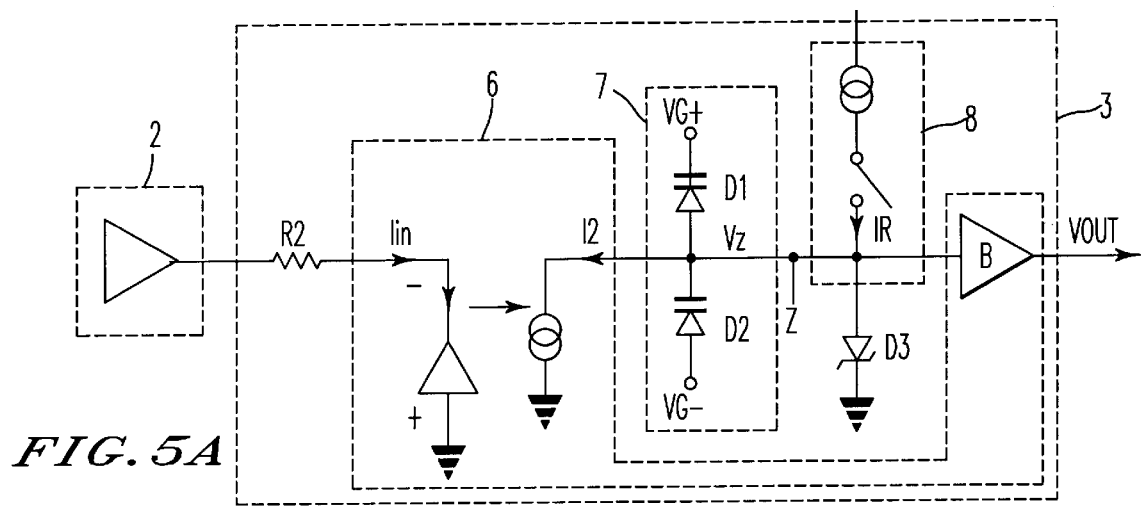
FIGS. 5A–C show a realization of the charge-to-voltage converter, the time behaviour of the input current, of the integrated voltage and of the reset charge, and the voltage-capacitance relation of variable capacitance diodes.

In the invention R2, instead of being connected to ground (FIG. 4A), is connected to the charge-to-voltage converter 3 and, more specifically, to the negative input of a transimpedance amplifier 6 which is held at ground level (FIG. 5). The input stage of the transimpedance amplifier 6 is a current conveyor circuit whose function is to duplicate input current $I_{in}$ onto the Z node (FIG. 5A). In some commercial transimpedance amplifiers the Z node is accessible to the external world. There it is possible to realize a variable gain charge integrator 7 by adding two variable capacitance diodes D1 and D2 as well as a charge resetting circuit 8. The input charge pulse $Q_{in}$ of the charge-to-voltage converter is conveyed onto the node Z causing the voltage $V_z$ to shift by the amount $\Delta V_Z$ $$\Delta V_z = \frac{1}{C_z} \int i_{IN} \cdot dt = \frac{Q_{in}}{C_z} \quad (7)$$

with $$C_Z = C_{D1} + C_{D2} + C_{parasitics} \quad (8)$$

Figure 5B:
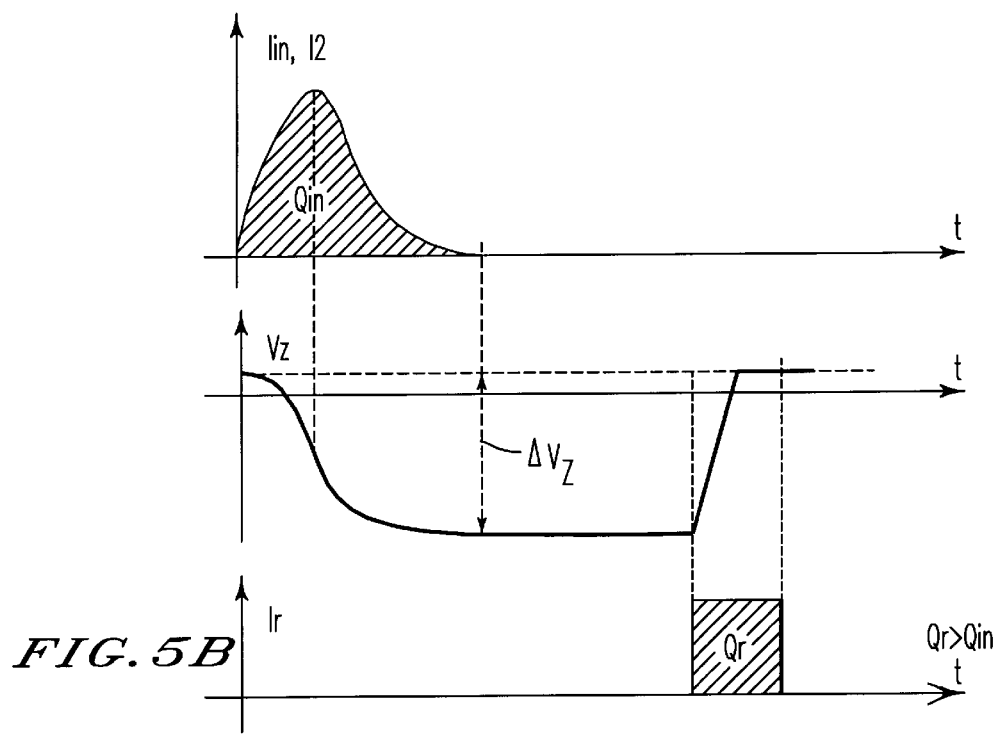
Figure 5C:
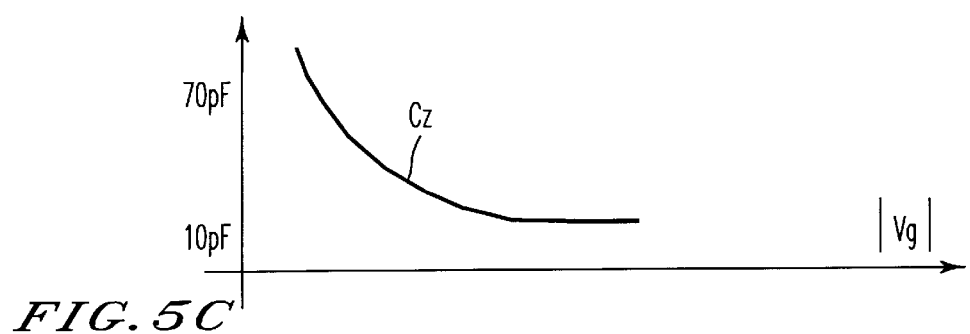

The dependence of $C_Z$ on $V_G$ is given by FIG. 5C. The gain of the integrator can therefore be controlled by setting $V_G+$, $V_G-$ accordingly.

Once the charge $Q_{in}$ is fully integrated, the voltage $V_Z$ is steady and the corresponding $V_{out}$, available over buffer B, can be digitized directly by an analog to digital converter. Once digitized, the integrated charge must be reset before arrival of the next charge packet; this operation is done via the reset switch current $I_R$ pulling $V_Z$ up to the point where D3 starts conducting. This achieves the reset operation, as illustrated in FIG. 5B.

Figure 6:
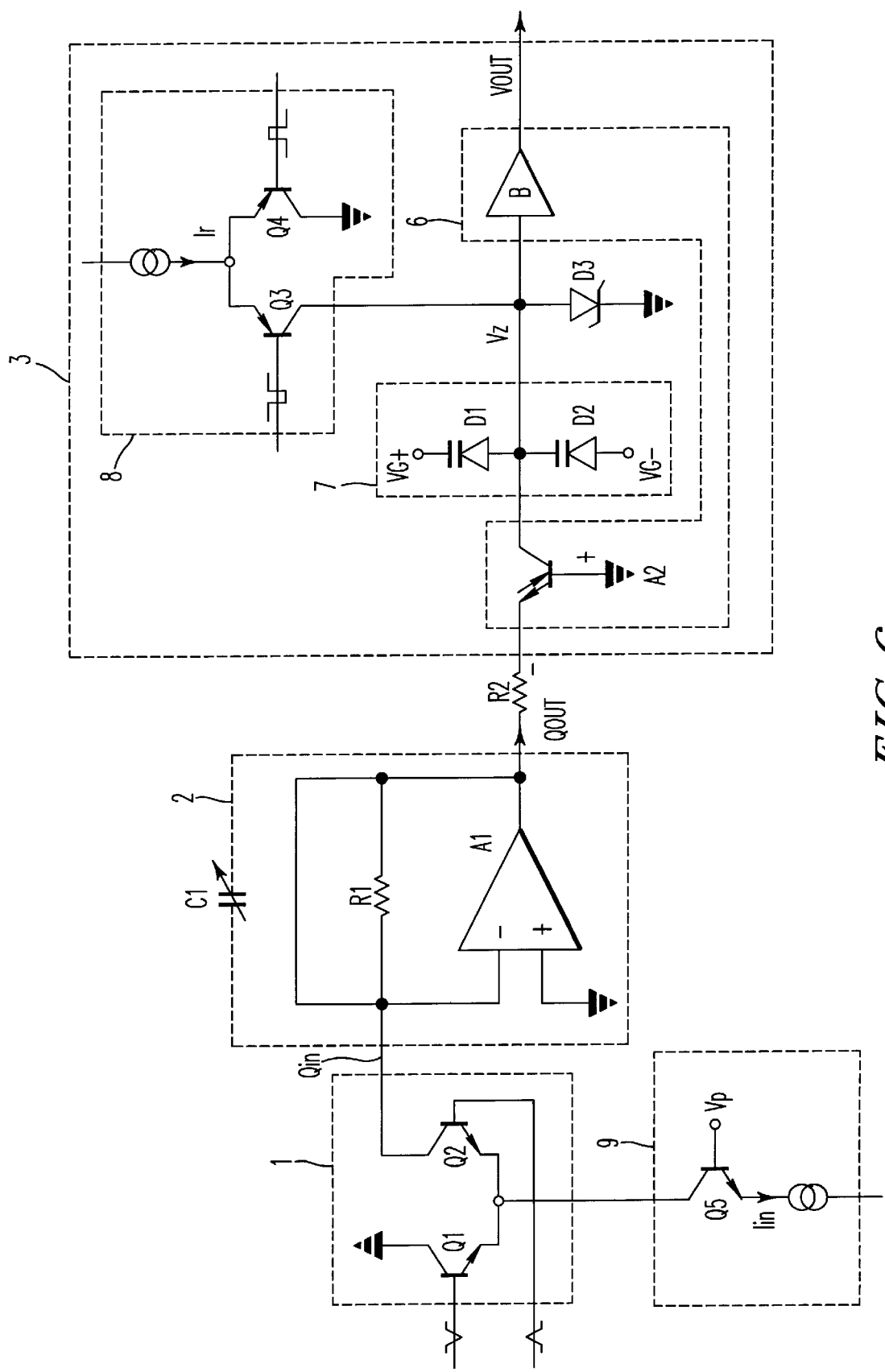
FIG. 6. shows the overall circuit schematic of the inventive sampling circuit including an isolation buffer.

FIG. 6 shows an overview of the preferred embodiment of the invention as described, preceded by an isolation buffer 9. Q1, Q2 are the current switches of the sampling switch 1, A1 is the operational amplifier of the charge amplifier 2, A2 together with D1, D2 as variable capacitors becomes the charge-to-voltage converter, by and Q3, Q4 are reset current switches with D3 as reset diode for the resetting circuit 8.

What is claimed is:

1. Sampling circuit for a digital oscilloscope, comprising:
    a current sampling switch for receiving an input and whose output represents a charge packet a charge amplifier having an input receiving the charge packet; and
    a charge-to-voltage converter having an input connected to an output of the charge amplifier.

2. Sampling circuit according to claim 1, wherein the current sampling switch comprises a pair of emitter coupled transistors.

3. Sampling circuit according to claim 1, wherein the charge amplifier comprises:
    an operational amplifier, its negative input port being connected to the output of the current sampling switch; and
    a feedback network including a resistor in parallel with a capacitor connecting the output port of the operational amplifier to the negative input port of the operational amplifier.

4. Sampling circuit according to claim 3, wherein the charge-to-voltage converter comprises:
    a transimpedance amplifier having a negative input connected by a resistor to the output port of the charge amplifier and outputting a voltage corresponding to the charge packet.

5. Sampling circuit according to claim 4, wherein the charge-to-voltage converter further comprises:
    a variable gain charge integrator for storing the charge packet; and
    a charge resetting circuit for resetting said charge packet;
    said variable gain charge integrator and said charge resetting circuit both being connected to a common external summing mode of the transimpedance amplifier.

6. Sampling circuit according to claim 5, a capacitance at the summing node of the transimpedance amplifier created by two variable capacitance diodes connected between the summing node of the transimpedance amplifier and adjustable voltage levels $+V_G$, and $-V_G$, and wherein the gain of the variable gain charge integrator is inversely proportional to the capacitance provided by said diodes.

7. Sampling circuit according to claim 5, characterized in that the charge resetting circuit comprises a switchable current source $I_R$ connected to summing node for cancelling the charge integrated at the summing node.

* * * * *